(12) United States Patent
Paruchuri et al.

(10) Patent No.: US 6,360,939 B1
(45) Date of Patent: *Mar. 26, 2002

(54) LEAD-FREE ELECTRICAL SOLDER AND METHOD OF MANUFACTURING

(75) Inventors: Mohan R. Paruchuri, Canton; Dongkai Shangguan, Livonia, both of MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/414,207

(22) Filed: Oct. 7, 1998

Related U.S. Application Data

(63) Continuation-in-part of application No. 08/827,589, filed on Mar. 28, 1997, now Pat. No. 5,928,404.

(51) Int. Cl.$^7$ ................................................. B23K 31/02
(52) U.S. Cl. ................................. 228/248.5; 228/180.22
(58) Field of Search .......................... 228/248.5, 124.1, 228/224, 214, 245, 248.1, 253, 254; 75/255; 420/562, 557, 558, 561, 573, 564; 148/26

(56) References Cited

U.S. PATENT DOCUMENTS

| | | |
|---|---|---|
| 1,565,115 A | 12/1925 | Speed et al. |
| 3,157,473 A | 11/1964 | Acton et al. |
| 3,503,721 A | 3/1970 | Lupfer |
| 3,607,253 A | 9/1971 | Cain et al. |
| 4,011,056 A | 3/1977 | Steine et al. |
| 4,214,903 A | 7/1980 | Murabayashi et al. |
| 4,758,407 A | 7/1988 | Ballentine et al. |
| 4,797,328 A | 1/1989 | Boehm et al. |
| 4,806,309 A | 2/1989 | Tulman |
| 5,062,896 A | * 11/1991 | Huang et al. .......... 106/287.19 |
| 5,088,189 A | * 2/1992 | Brown ........................ 29/840 |
| 5,127,969 A | 7/1992 | Sekhar |
| 5,229,070 A | * 7/1993 | Melton et al. ............... 420/557 |
| 5,320,272 A | * 6/1994 | Melton et al. ......... 228/180.21 |
| 5,328,660 A | 7/1994 | Gonya et al. |
| 5,344,607 A | 9/1994 | Gonya et al. |
| 5,346,558 A | * 9/1994 | Mathias ........................ 148/23 |
| 5,350,105 A | 9/1994 | Delalle et al. |
| 5,414,303 A | * 5/1995 | Gonya et al. ................ 257/772 |
| 5,429,689 A | 7/1995 | Shangguan et al. |
| 5,455,004 A | 10/1995 | Slattery et al. |
| 5,540,379 A | * 7/1996 | Kazem-Goudarzi et al. ..... 228/248.5 |
| 5,658,528 A | * 8/1997 | Ninomiya et al. ........... 420/562 |
| 5,733,501 A | * 3/1998 | Takao et al. ................. 420/562 |
| 5,803,340 A | * 9/1998 | Yeh et al. |
| 5,980,822 A | * 11/1999 | Moon et al. ................. 420/561 |
| 6,025,258 A | * 2/2000 | Ochiai et al. ............... 438/613 |
| 6,039,616 A | * 3/2000 | Pereira et al. .............. 439/874 |

* cited by examiner

*Primary Examiner*—Tom Dunn
*Assistant Examiner*—Jonathan Johnson
(74) *Attorney, Agent, or Firm*—Larry Shelton

(57) ABSTRACT

A method of manufacturing a lead-free electrical solder paste having primary solder powder and an additive metal powder component that does not melt during the soldering process. Metal powders may be either elemental metal or a metal alloy. The primary powder is the same as is used in conventional solder paste. The additive powder has a melting point substantially higher than the melting point of the primary powder. The primary powder comprises between 80–99% Sn and 1–20% Ag. The additive powder metal is selected from the metal group comprising Sn, Ni, Cu, Ag, and Bi and mixtures thereof.

11 Claims, 1 Drawing Sheet

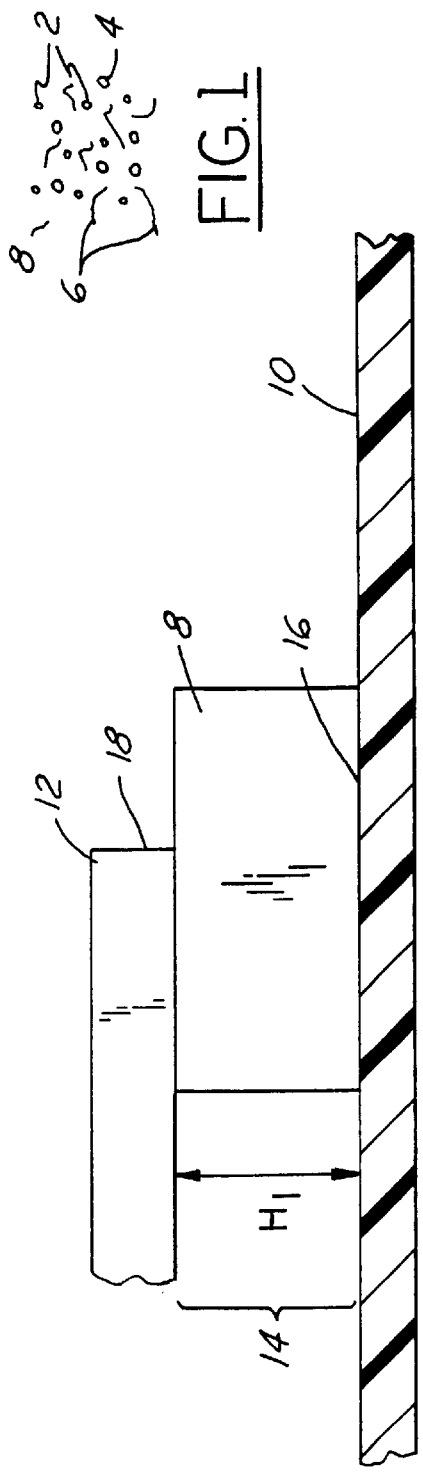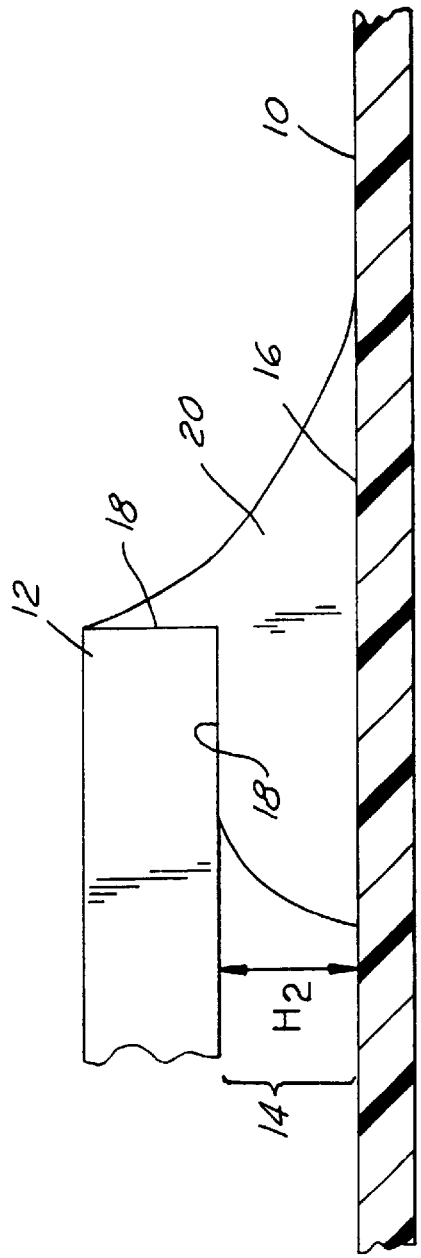

LEAD-FREE ELECTRICAL SOLDER AND METHOD OF MANUFACTURING

CROSS-REFERENCE TO RELATED APPLICATION

This application is a continuation-in-part of U.S. application Ser. No. 08/827,589, filed Mar. 28, 1997, now U.S. Pat. No. 5,928,404, issued Jul. 27, 1999.

BACKGROUND OF THE INVENTION

1. Technical Field

The present invention relates to a lead-free electrical solder composition having a primary metal powder and an additive metal powder mixed into a solder paste. The metal powder may be either an elemental metal or a metal alloy. More specifically, the present invention relates to a method of manufacturing a lead-free electrical solder having a primary metal powder and a higher melting temperature, additive metal powder mixed therein.

2. Description of the Related Art

It is known to manufacture an electrical solder paste that is made of metal or alloy particles mixed with flux. In such conventional solder paste, the metal particles are made by melting a metal or alloy ingot and atomizing the molten metal into fine particles of suitable size distribution. Such solder paste can be used for electronics packaging. The solder paste is first printed onto the bond pad of the substrate whereupon the electrical circuit resides. The substrate material may be, for example, fiber-reinforced epoxy resin (for example FR4) or ceramics (for example alumina). A solder paste is applied to the substrate and electronic components are placed onto the printed solder. The assembly is sent through an oven with a prescribed temperature profile, such that the metal particles in the solder paste will melt, flow and spread to the component termination surface and then re-solidify as the solder cools. The solder forms joints between the electronic components and the electronic circuit on the substrate. The solder joints serve as electrical interconnects between the electronic components and the electrical circuitry on the substrate of the electronic module.

The electronic module both heats and cools from the current passing through the electronic component and from the exposure to ambient temperatures. Because the electronic component, solder, and substrate are each made of different materials, they expand and contract differently in response to such temperature variations. As a result, large thermomechanical loading including stress and strain is imposed on the solder. The situation is especially severe in automotive applications because the temperature variations are very large and are repeated thousands of times over the life of the vehicle. Coupled with the vibrations from the road, the interconnects are exposed to very large stress and strain. Under such conditions, the solder microstructure coarsens, and weakens the solder joint. Eventually, the solder interconnect may develop fatigue failures by crack initiation and propagation through the solder joint, rendering the electronic module non-functional. It is therefore highly desirable to produce solder joints that are resistant to such fatigue failures.

Tin-lead solders (63%Sn-37%Pb, or 62%Sn-36%Pb-2%Ag) are widely used in current production of automotive electronic modules. More recently, tin-silver solder (96.5%Sn-3.5%Ag) has been used as a lead-free solder for automotive electronics. Solder manufacturing processes such as alloy making, atomization and flux formulation as well as soldering process parameters such as printing and reflow have been well established. However, these solders frequently suffer from the fatigue failures as described above in automotive applications, especially for large size electronic components.

In order to enhance the reliability of the solder joint, two approaches can be taken. In the first approach (the 'material approach'), a different and more fatigue resistant solder material can be used. Such solder materials should be stable and resistant to coarsening and fatigue damage. The choice of materials for this approach, however, is limited by the fact that the solder must also possess chemical and physical characteristics (such as melting temperature, wettability, etc.) suitable for soldering and properties (such as corrosion resistance, thermal/electrical conductivities, etc.) required for the intended application. It is therefore advantageous for any new solders to be based on the currently used Sn—Pb and Sn—Ag solders. The second approach (the 'geometry approach') is to produce solder joints that have a large stand-off height (the height of the solder between the substrate and the component). In the case of leadless chip components, for example, the fatigue life of the solder joint has been shown roughly to be inversely proportional to the maximum shear strain in the stand-off region of the solder joint, which arises as a result of temperature variations due to the difference in the coefficient of thermal expansion (CTE) for the various materials involved; this maximum shear strain is in turn, generally speaking, inversely proportional to the stand-off height. Therefore, increasing the stand-off height is expected to increase the solder joint fatigue life. This however is not simple to achieve, because on the one hand, the amount of solder paste that can be deposited on the bond pad is limited by the printing process in high volume production due to the presence of fine pitch devices on the same module; and on the other hand, when the solder paste melts, it flows and spreads to the end of the component termination therefore reducing the amount of solder that is left between the component and the substrate.

U.S. Pat. No. 5,127,969 ('969) teaches an electrical solder ingot containing a metal alloy and a reinforcement material mixed therein, and a method for its manufacture. The reinforcement material may be either a metal, metal alloy or carbon fiber. The reinforcement material is formed into a particulate or fibrous form and mixed with the solder alloy. The electrical solder is heated to a molten or semi-solid state and reinforcement material is mixed therein under "vigorous shearing". However, it is believed that the composition taught in the '969 patent cannot be used for the application intended for the present invention. In any soldering application, the solder ingot will have to be remelted. For example, in solder paste manufacturing, the solder ingot has to be remelted and atomized into fine particles in the range of 30–50 microns. This process however will completely separate the solder alloy and the reinforcement material. Notwithstanding the assertion that the composite retains its desired microstructure after remelting, it is believed that remelting the composite solder ingot will cause the distributed reinforcement particles to completely separate from the solder alloy. The only way of using the '969 patent may be in the form of solder wires in hand soldering; but even in hand soldering, separation is still expected to occur. Further, hand soldering is a low volume, low speed operation and is therefore not the object of the present invention.

U.S. Pat. No. 5,350,105 ('105) teaches a solder connection having a first solder portion with a first melting point and a second solder portion with a second melting point that is higher than the first melting point. The purpose of this construction is for the second solder portion to indicate when the first solder portion has flowed and/or to control the flow of the first solder portion. The '105 patent further teaches the use of two solder alloys that remain separate. These alloys do not improve the mechanical, physical or electrical properties of the resulting solder connection.

The present invention seeks to simultaneously utilize the two approaches described previously (the materials approach and the geometry approach) to enhance solder interconnect fatigue life. It is therefore desirable to have a composite solder that retains the general physical properties of the currently used solder but also have improved mechanical performance over the life of the electronic module. It is further desirable that the composite solder be compatible with existing high volume solder manufacturing methods. Further, it is desired that the solder be applied as a paste using high speed printing and transfer equipment, for reflow soldering which is the predominant electronic packaging process preferred for automotive applications. It is further desirable that the solder composition be free of lead.

SUMMARY OF THE INVENTION

Currently, most solder alloys are produced by mixing a predetermined proportion of ingredients in a metal or ceramic crucible and heating the mixture until the metals become molten. The molten metal is then poured into molds, and ingots are made when the metal cools and solidifies. To make solder paste, the ingots are re-melted and atomized in a controlled atmosphere to make a fine solder powder. The resulting powder is mixed with flux to form a solder paste. The solder paste is applied to a circuit board through stencil or screen printing, and electronic components are placed on the printed paste. The circuit board is then placed into an oven and heated to a temperature sufficient to cause the solder powder to melt and flow. When the temperature decreases, the molten solder solidifies forming solder joints with the electronic components.

The present invention relates to a method of manufacturing a lead-free electrical solder paste that includes, in addition to the primary solder powder used in conventional solder paste, an additive metal powder component that does not melt (except for a certain amount of dissolution) during the soldering process. This additive metal or alloy powder component causes the solder to be more viscous and therefore creates solder joints with large stand-off heights. Further, the solder joints are significantly more resistant to fatigue damage over the life of the electronic module.

The lead-free electrical solder is manufactured by mixing a first metal powder (the primary powder) and a second metal powder (the additive powder). Metal powders may be either elemental metal or a metal alloy. The powders are made by conventional methods such as re-melting the metal ingot followed by atomization. The primary powder is the same as is used in conventional solder paste. The additive powder has a melting point substantially higher than the melting point of the primary powder. The primary powder and the additive powder are mixed in predetermined proportions with flux to form a solder paste. The method of mixing powders with flux to form a solder paste is well established. Conventional fluxes are used, which may include ingredients that serve as vehicles, oxide-removal agents, etc. Solder paste characteristics (e.g. thixotropy) suitable for storage, printing, and other process requirements are well established.

As a result of developing the method of the present invention, it was discovered that a solder composition having a tin-silver alloy (e.g. 96.5% Sn-3.5% Ag) powder (the primary powder) mixed with additive powder of bismuth (Bi) (3–20% preferably 3–15% of total metal weight), silver (Ag) (3–11% of total metal weight), copper (Cu) (3–10% of total metal weight), or nickel (Ni) (3–10% of total metal weight), or combinations thereof, provides a solder which has improved fatigue and creep resistance and does not contain toxic ingredients. The phrase total metal weight is the weight percentage of a elemental or alloy metal in comparison to the weight of all of the metal components of the solder paste, but excluding the weight of the flux. A solder having 3–11% of total metal weight of bismuth has been found to be an especially effective additive powder for the tin-silver alloy.

It is also a desired object of the present invention to provide a solder exhibiting favorable thermal and electrical conductivities. Yet another object of the invention is to provide a solder composition that is affordable and in reasonable supply for large production use and that takes advantage of existing high volume production equipment and soldering processes. These and other advantages, features and objects of the present invention will become more apparent to those of ordinary skill in the art upon reference of the following description.

BRIEF DESCRIPTION OF THE DRAWINGS

FIG. 1 is a schematic drawing showing the make-up of the solder paste.

FIG. 2 is cross-sectional view of a solder joint prior to heating.

FIG. 3 is cross-sectional view of a solder joint after heating.

DETAILED DESCRIPTION OF THE PREFERRED EMBODIMENT

The present invention is directed to a composite solder composition that provides good fatigue and creep resistance. It is especially directed to providing a durable and damage resistant electrical interconnect for electronic components exposed to wide temperature variations as is commonly encountered in automotive applications. A common accelerated test for measuring the durability of a solder for automotive applications is to expose the interconnect to a large temperature variation, typically from −55 to 125° C. This temperature variation is repeated for up to 2000 cycles. Each cycle from hot to cold causes the substrate, electronic components, metal leads, and solder to expand and contract (often with widely different CTEs). The cycle of expansion and contraction generates thermomechanical loading in the solder joint.

While not wishing to be bound by the following theory, it is believed that the thermal cycling causes the microstructure of the solder to coarsen. The coarsened microstructure results in a weakened solder. Eventually, under thermomechanical loading (stress/strain), cracks are initiated in the solder and then propagate through the joint and eventually the interconnect fails making the electronic module inoperable. The inclusion of the additive powder in the solder paste in the present invention, while not changing any of the soldering process parameters or component/substrate properties, produces larger stand-off heights in the solder joint and thus reduces the magnitude of the shear strain in the joint. The inclusion of the additive powder also has a reinforcing effect on the solder joint due to the higher melting point and fine microstructure. The solder exhibits an increased solder microstructural stability (i.e. reduced microstructural coarsening) under cyclic thermomechanical loading. It is this combination of increased strength with reduced loading that leads to increased fatigue life of the solder interconnects. The physical properties of the solder allow for the use of existing production processes and equipment.

The solder compositions that were found to include the preferred properties include solders having a primary powder of tin-silver alloy, and an additive powder of tin, silver, nickel, copper, or bismuth, or combinations thereof. Bismuth was especially preferred.

FABRICATION AND SAMPLE COMPOSITIONS

Commercially available metal particles, having an average particle size between 30–100 microns, were obtained. As illustrated in FIG. 1, primary powder 2 and additive powder 4 were mixed in predetermined proportions with flux 6 to form solder paste 8. The following samples were made.

EXAMPLES

TABLE 1

| Sample No. | Primary Powder Alloy Composition (wt. %) | Additive Metal Powder (wt. % of total metal.) | Cycles before 0% solder joint failure |
|---|---|---|---|
| 1 | 96.5Sn, 3.5 Ag | none (PRIOR ART) | <250 |
| 2 | 96.5Sn, 3.5 Ag | 5.6 Ni | <250 |
| 3 | 96.5Sn, 3.5 Ag | 5.6 Cu | 500–750 |
| 4 | 96.5Sn, 3.5 Ag | 5.6 Ag | 750–1000 |
| 5 | 96.5Sn, 3.5 Ag | 11 Ag | 250–500 |
| 6 | 96.5Sn, 3.5 Ag | 5.6 Bi | 1500–1750 |
| 7 | 96.5Sn, 3.5 Ag | 11 Bi | 1250–1500 |

The solder paste 8 thus made may be applied with conventional solder printing method and apparatus such as stencil printing or screen printing. The solder paste 8 is applied atop a circuit board 10 as illustrated in FIGS. 2–3. An electronic component 12 (e.g. surface mount devices, SMD) is then placed onto the solder paste 8. The assembly 14 then is sent through an oven with a predetermined thermal profile, the peak temperature of the profile being such that the primary powder 2 melts and flows to wet the bond pad 16 on the substrate 10. The melted primary powder 2 also wets the component termination surfaces 18. The additive powder 4 does not melt (except for a certain amount of dissolution). The assembly 14 is removed from the oven and allowed to cool. The solder solidifies and forms a solder joint 20 between the electronic component 12 and the substrate 10. The additive powder 4 is dispersed through the solder joint 20. The stand-off height $H_2$ of the solder joint 20 is less than the printed solder paste thickness $H_1$.

To assess the reliability of the composite solder paste, printed wiring boards (PWB) were assembled with 2512 ceramic chip resistors soldered on FR4 substrate. The 2512 resistor was selected for its large size which generates large shear strains in the solder joint and thus accelerates the failure process. Boards thus made were subjected to a severe thermal cycling regime, from –55 to 125° C., for up to 2000 cycles. The solder joint continuity was examined electrically at 250 cycle intervals. The results are listed in Table 1 above.

Example

A composite solder was prepared with particles of a solder alloy (96.5%Sn-3.5%Ag), mixed with bismuth particles in proportions ranging from 5.6% to 11% (as a percentage of the total metal weight of the paste), and a no-clean RMA (rosin mildly activated) flux, to form a solder paste. The 96.5%Sn-3.5%Ag and Bi powders were of a –325/+500 mesh size. The solder paste was applied to a substrate via a stencil printing process. Electrical components (2512 ceramic chip resistors) were placed atop the solder paste. The assembly comprising the substrate, solder paste, and components was passed through a reflow oven and heated to a peak temperature between 240–255° C. The melting temperature of the alloy powder was approximately 221° C. The melting temperature of the bismuth powder was approximately 271° C. Therefore, the bismuth powder did not melt (except for a certain amount of dissolution) during the reflow process. The 96.5%Sn-3.5%Ag powder melted, flowed and spread across the bond pad on the substrate and component termination surfaces and formed a metallurgical bond with the component and the bond pad when it re-solidified as the temperature decreased. The bismuth powder was embedded within the solder joint with good metallurgical bonding.

After soldering, the interconnect displayed significantly larger stand-off height between the component and the substrate than those produced with conventional solder paste. The microstructure of the solder joint is refined because of the presence of bismuth metal particles in the solder. When the solder joint is subjected to thermomechanical loading, the bismuth particles have a reinforcing effect on the solder joint due to the higher melting point and the fine microstructure which is inherent in the bismuth particle due to the high cooling rate during the atomization process. Further, the microstructural stability under cyclic thermomechanical loading and the mechanical strength of the composite solder is greater than regular solders due to the presence of the bismuth particles.

Test boards built with the composite solder paste containing 5.55% bismuth particles showed no solder joint failures after 1500 cycles. Test boards built with conventional solder paste had solder joint failures before 250 cycles and showed 63% solder joint failures after 1500 cycles. This indicated that the fatigue life of solder having 5.55% bismuth was greatly increased over solders not having an additive metal powder.

Similarly, the composite solder paste can be applied by printing or dispensing onto silicon chips with metallized areas and reflowed to form solder bumps for flip chips. Because of the composite solder has a high resistance to fatigue damage, flip chips with composite solder bumps may be used on ceramic substrates or PWBs, with or without underfills or encapsulants.

APPLICATION

Composite solder pastes were found to be readily manufacturable using existing equipment and processes. Because of the relatively low silver content, the alloys were low cost and suitable for production in large commercial quantities. The solder paste comprising primary powder of the 96.5%Sn-3.5%Ag alloy and additive powder of nickel, silver, copper, or bismuth, is a lead-free solder composition and does not contain toxic ingredients. The solder paste made from these compositions may be used with regular printing equipment and reflowed using conventional solder reflow equipment and processes. The peak soldering temperature will generally be at least 10–15° C. or preferably 10–30° C. above the melting temperature of the primary powder alloy, but below the melting temperature of the additive powder metal.

Other forms of application are also possible. Composite solder paste may be formulated for stencil or screen printing, or syringe dispensing. The composite solder paste may be applied throughout the substrate of a module, or it may be applied to only selected components which require increased fatigue damage resistance. In one example of application, the composite solder paste may be printed or dispensed into an area of certain dimensions, and then reflowed into preforms to be used for die attachment applications. Extrusion or other methods may also be used to manufacture solder preforms. In another application example, composite solder paste may be applied to the substrate and reflowed without first placing the components to form pre-deposited solder on the substrate. Components may be placed onto the pre-deposited solder at a different manufacturing location and then reheated to reflow the solder and attach the component.

Different alloys may be adapted for different applications. Alloys of indium/bismuth, bismuth/tin, tin/indium, and tin/zinc were all found to be useful by utilizing the method disclosed herein. Elemental metal powders of tin, nickel, copper, silver, bismuth, and combinations thereof were also found to be suitable additive metal powders.

While the best mode for carrying out the present invention has been described in detail, those familiar with the art in which the invention relates will recognize the various alternative compositions and methods that are possible for practicing the invention as defined by the following claims.

What is claimed:

1. A method of manufacturing an electrical solder comprising:

forming a primary metal powder having a first melting temperature;

forming an additive metal powder having a second melting temperature substantially higher than the first melting temperature; and mixing said primary metal powder and said additive metal powder with flux to form said solder, said solder having said additive metal powder within a range of from 3% to 20% of total metal weight.

2. The method of claim 1, wherein said primary and additive metal powders are manufactured by remelting a metal ingot and atomizing the molten metal into fine metal particles in a controlled atmosphere.

3. A method of manufacturing solder interconnects for electrical components comprising the steps of:

forming a primary metal powder having a first melting temperature;

forming an additive metal powder having a second melting temperature substantially higher than the first melting temperature; and mixing said primary metal powder and said additive metal powder with flux to form a solder paste, said solder paste having said additive metal powder within a range of from 3% to 20% of total metal weight;

applying said solder paste to a substrate;

placing components onto said solder paste;

heating said solder paste to a temperature above said first melting temperature and less than said second melting temperature and causing said primary powder metal to melt and flow while said additive metal powder remains generally solid; and cooling said solder and causing said solder to solidify with particles of said additive powder distributed therein.

4. A method of forming solder deposits on a substrate for use as a carrier for electrical components comprising the steps of:

mixing a primary metal powder having a first melting temperature and an additive metal powder having a second melting temperature with flux to form a solder paste, said first melting temperature being substantially higher than said second melting temperature, said solder paste having said additive metal powder within a range of from 3% to 20% of total metal weight;

applying said solder paste to a substrate;

heating said solder paste to a temperature above said first melting temperature and less than said second melting temperature and causing said primary powder metal to melt and flow while said additive metal powder remains generally solid to form a solder; and cooling said solder and causing said solder to solidify with particles of said additive powder distributed therein.

5. The method of claim 1, wherein said additive metal powder comprises bismuth.

6. The method of claim 1, wherein said additive metal powder comprises copper.

7. The method of claim 1, wherein said additive metal powder comprises nickel.

8. The method of claim 1, wherein said primary metal powder comprises a tin-silver alloy and said additive metal powder comprises bismuth.

9. The method of claim 1, wherein said solder has said additive metal powder within a range of from 3% to 15% of total metal weight.

10. The method of claim 1, wherein said solder is lead-free.

11. The method of claim 10, wherein said primary metal powder comprises a tin-silver alloy and said additive metal powder comprises bismuth.

* * * * *